United States Patent
Choi

(10) Patent No.: US 10,937,359 B2
(45) Date of Patent: Mar. 2, 2021

(54) SOURCE DRIVER AND DISPLAY APPARATUS INCLUDING THE SAME

(71) Applicant: DB HiTek Co., Ltd., Seoul (KR)

(72) Inventor: Yong Ho Choi, Seoul (KR)

(73) Assignee: DB HiTek Co., Ltd., Seoul (KR)

( * ) Notice: Subject to any disclaimer, the term of this patent is extended or adjusted under 35 U.S.C. 154(b) by 161 days.

(21) Appl. No.: 16/044,348

(22) Filed: Jul. 24, 2018

(65) Prior Publication Data

US 2019/0172387 A1 Jun. 6, 2019

(30) Foreign Application Priority Data

Dec. 6, 2017 (KR) .................. 10-2017-0166467

(51) Int. Cl.
G09G 3/22 (2006.01)
G09G 3/36 (2006.01)
H03M 1/66 (2006.01)
G09G 3/3275 (2016.01)

(52) U.S. Cl.
CPC ............ G09G 3/22 (2013.01); G09G 3/3275 (2013.01); G09G 3/3611 (2013.01); G09G 3/3688 (2013.01); H03M 1/66 (2013.01); G09G 2310/027 (2013.01); G09G 2310/0275 (2013.01); G09G 2310/0286 (2013.01); G09G 2310/0289 (2013.01); G09G 2330/04 (2013.01)

(58) Field of Classification Search
None
See application file for complete search history.

(56) References Cited

U.S. PATENT DOCUMENTS

| | | | | |
|---|---|---|---|---|
| 10,089,945 B2* | 10/2018 | Kim | ............ | G09G 3/3614 |
| 2004/0125065 A1* | 7/2004 | Park | ............ | G09G 3/20 345/92 |
| 2008/0218500 A1* | 9/2008 | Akai | ............ | G09G 3/3688 345/205 |
| 2009/0153220 A1* | 6/2009 | Lee | ............ | G09G 3/3688 327/333 |
| 2011/0187457 A1* | 8/2011 | Hsu | ............ | H03F 1/56 330/192 |
| 2011/0199397 A1* | 8/2011 | Ko | ............ | G09G 3/3688 345/690 |
| 2012/0280961 A1* | 11/2012 | Son | ............ | G09G 3/3685 345/211 |
| 2013/0127806 A1* | 5/2013 | Wu | ............ | G09G 3/3688 345/211 |

(Continued)

*Primary Examiner* — Benjamin X Casarez
(74) *Attorney, Agent, or Firm* — Andrew D. Fortney; Central California IP Group, P.C.

(57) ABSTRACT

A source driver includes a digital-to-analog converter configured to receive a data signal, convert the received data signal into an analog signal, and output the analog signal, an output unit including amplifiers configured to amplify the analog signal, a control signal provision unit configured to output at least one control signal based on or in response to a first bias signal, at least one level shifter configured to shift a level of the control signal(s) based on or in response to a second bias signal having a higher voltage than the first bias signal and output at least one level-shifted control signal, and a protector configured to detect a voltage of the first bias signal and turn off the amplifiers and the level shifter when the detected voltage of the first bias signal is less than a predetermined reference voltage.

12 Claims, 3 Drawing Sheets

(56) References Cited

U.S. PATENT DOCUMENTS

2014/0306872 A1* 10/2014 Yun .................... G09G 3/3618
  345/99
2015/0310812 A1* 10/2015 Chen ................... G09G 3/3696
  345/691
2016/0322011 A1* 11/2016 Park .................... G09G 3/3685

* cited by examiner

SOURCE DRIVER AND DISPLAY APPARATUS INCLUDING THE SAME

This application claims the benefit of Korean Patent Application No. 10-2017-0166467, filed on Dec. 6, 2017, which is hereby incorporated by reference as if fully set forth herein.

BACKGROUND OF THE INVENTION

Field of the Invention

Embodiments of the present invention relate to a source driver and a display device including the same.

Discussion of the Related Art

A source driver may generate a control signal and data using an input signal received through an interface block that utilizes a low-voltage power source, and then generate a high-voltage control signal using a level shifter. A plurality of amplifiers and a high-voltage block necessary to output signals from the source driver may be controlled by the generated high-voltage control signal.

A plurality of output amplifiers in the source driver has an output range from a voltage close to 0V to a value close to a first voltage (e.g., VDD). Since the output terminals of the plurality of output amplifiers having different grayscale values share charged current while repeating an ON/OFF process or operation using a multiplexer and a charge sharing switch, the timing process or operation should be accurately controlled to avoid a short-circuit between outputs.

If an abnormality occurs in the low-voltage power source, the low-voltage power source may generate an abnormal control signal. Due to such an abnormal control signal, the output from the level shifter may be abnormal. Having an abnormal output from the level shifter, the ON/OFF process or operation of the multiplexer and the charge sharing switch connected between the output terminals of the source driver may be abnormal. Thus, a short-circuit may occur between the amplifier outputs that have different output values, thereby damaging the source driver or causing a fire when a chip including the source driver and/or amplifiers is on a flexible printed circuit (e.g., "chip-on-flex" or COF) film package.

SUMMARY OF THE INVENTION

Accordingly, embodiments of the present invention are directed to a source driver and a display device including the source driver that substantially obviate one or more problems due to limitations and disadvantages of the related art.

An object of embodiments of the present invention is to provide a source driver capable of preventing damage or ignition due to overcurrent or excess current when the voltage level of a low-voltage power source abnormally drops. Embodiments of the present invention also include a display device including the source driver.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof, as well as the appended drawings.

To achieve these objects and other advantages and in accordance with the purpose(s) of the invention, as embodied and broadly described herein, the source driver includes a digital-to-analog converter configured to receive a data signal, convert the received data signal into an analog signal, and output the analog signal; an output unit including amplifiers configured to amplify the analog signal; a control signal provision unit configured to output at least one control signal based on or in response to a first bias signal; at least one level shifter configured to shift a level of the at least one control signal based on or in response to a second bias signal having a voltage higher than the first bias signal and output at least one level-shifted control signal; and a protector configured to detect a voltage of the first bias signal and turn off the amplifiers and the level shifter when the voltage of the first bias signal is less than a predetermined reference voltage.

The protector may detect the voltage of the first bias signal and cut off the voltages to one or more the amplifiers (e.g., the affected amplifier[s]) and corresponding one(s) of the level shifters when the detected voltage of the first bias signal is less than the predetermined reference voltage.

The source driver may further include a multiplexer configured to selectively output data signals from the amplifiers to output lines based on or in response to output of the at least one level shifter, and the protector may output a first deactivation (e.g., off control) signal configured to turn off the multiplexer when the detected voltage of the first bias signal is less than the predetermined reference voltage.

The source driver may further include a charge sharing switch configured to share a charge on the output lines corresponding to the amplifiers (e.g., the affected amplifiers), and the protector may output a second deactivation (e.g., off control) signal configured to turn off the charge sharing switch when the detected voltage of the first bias signal is less than the predetermined reference voltage.

The protector may turn on the amplifiers and the level shifter when the detected voltage of the first bias signal is equal to or greater than the predetermined reference voltage.

The protector may not output the first deactivation signal when the detected voltage of the first bias signal is equal to or greater than the predetermined reference voltage.

The protector may not output the second deactivation signal when the detected voltage of the first bias signal is equal to or greater than the predetermined reference voltage.

According to other embodiments of the present invention, the source driver includes a digital-to-analog converter configured to receive a data signal, convert the received data signal into an analog signal, and output the analog signal; amplifiers configured to amplify the analog signal, a control signal provision unit configured to output a first control signal and a second control signal based on or in response to a first bias signal; a first level shifter configured to shift a level of the first control signal based on or in response to a second bias signal having a voltage greater than that of the first bias signal and to output a level-shifted first control signal; a second level shifter configured to shift a level of the second control signal based on or in response to the second bias signal and output a level-shifted second control signal; output lines corresponding to the amplifiers; a multiplexer configured to selectively output data signals from the amplifiers to the output lines based on or in response to output of the first level shifter; a charge sharing switch connected between the output lines and controlled based on or in response to output of the second level shifter; and a protector configured to detect a voltage of the first bias signal and to turn off the amplifiers, the first level shifter and the second level shifter, and output a first deactivation signal configured to turn off the multiplexer and a second deactivation signal configured to turn off the charge sharing switch when the detected voltage of the first bias signal is less than a predetermined reference voltage.

The protector may output a first signal configured to turn off the amplifiers and a second signal configured to turn off the first and second level shifters when the detected voltage of the first bias signal is less than the predetermined reference voltage.

The protector may include a voltage detector configured to output a detection signal based on the voltage of the first bias signal, a voltage cutoff signal generator configured to output a first signal configured to turn off the amplifiers and a second signal configured to turn off the first and second level shifters based on or in response to the detection signal, and a deactivation signal generator configured to output the first deactivation signal and the second deactivation signal based on or in response to the detection signal.

The voltage detector may include a first transistor including a first gate configured to receive the first bias signal and a source and drain terminals connected between a first node and the ground; and a resistor configured to receive the second bias signal at one end and connected to the first node at another end. The detection signal may be output from the first node.

The voltage detector may include a transistor including a gate configured to receive the first bias signal and source and drain terminals connected between a first node and the ground; a resistor configured to receive the second bias signal at one end and connected to the first node at another end; and an inverter connected to the first node. The detection signal may be output from the first inverter.

The deactivation signal generator may include a first deactivation signal generator including a first transistor including a first gate, a first source configured to receive the second bias signal and a first drain connected to a second node and a second transistor including a second gate, a second drain connected to the second node; and a second source connected to the ground. The voltage cutoff signal generator may output a first gate control signal configured to control the first gate and a second control signal configured to control the second gate.

The second node may be connected to an output terminal of the first level shifter.

The first deactivation signal generator may further include a second inverter connected to the second node.

The deactivation signal generator may further include a second deactivation signal generator including a third transistor including a third gate, a third source configured to receive the second bias signal, and a third drain connected to a third node; and a fourth transistor including a fourth gate, a fourth drain connected to the third node, and a fourth source connected to the ground. The voltage cutoff signal generator may output a third gate control signal configured to control the third gate and a fourth gate control signal configured to control the fourth gate.

The third node may be connected to an output terminal of the third level shifter.

The second deactivation generator may further include a third inverter connected to the third node.

The protector may turn on the amplifiers and the first and second level shifters and may not output the first and second off signals when the detected voltage of the first bias signal is equal to or greater than the predetermined reference voltage.

According to one or more other embodiments of the present invention, a display device includes a display panel including gate lines, data lines, and pixels connected to the gate lines and the data lines in a matrix including rows and columns; a source driver configured to drive the data lines; and a gate driver configured to drive the gate lines. The source driver is the source driver according to any of the above-described embodiments.

It is to be understood that both the foregoing general description and the following detailed description of various embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
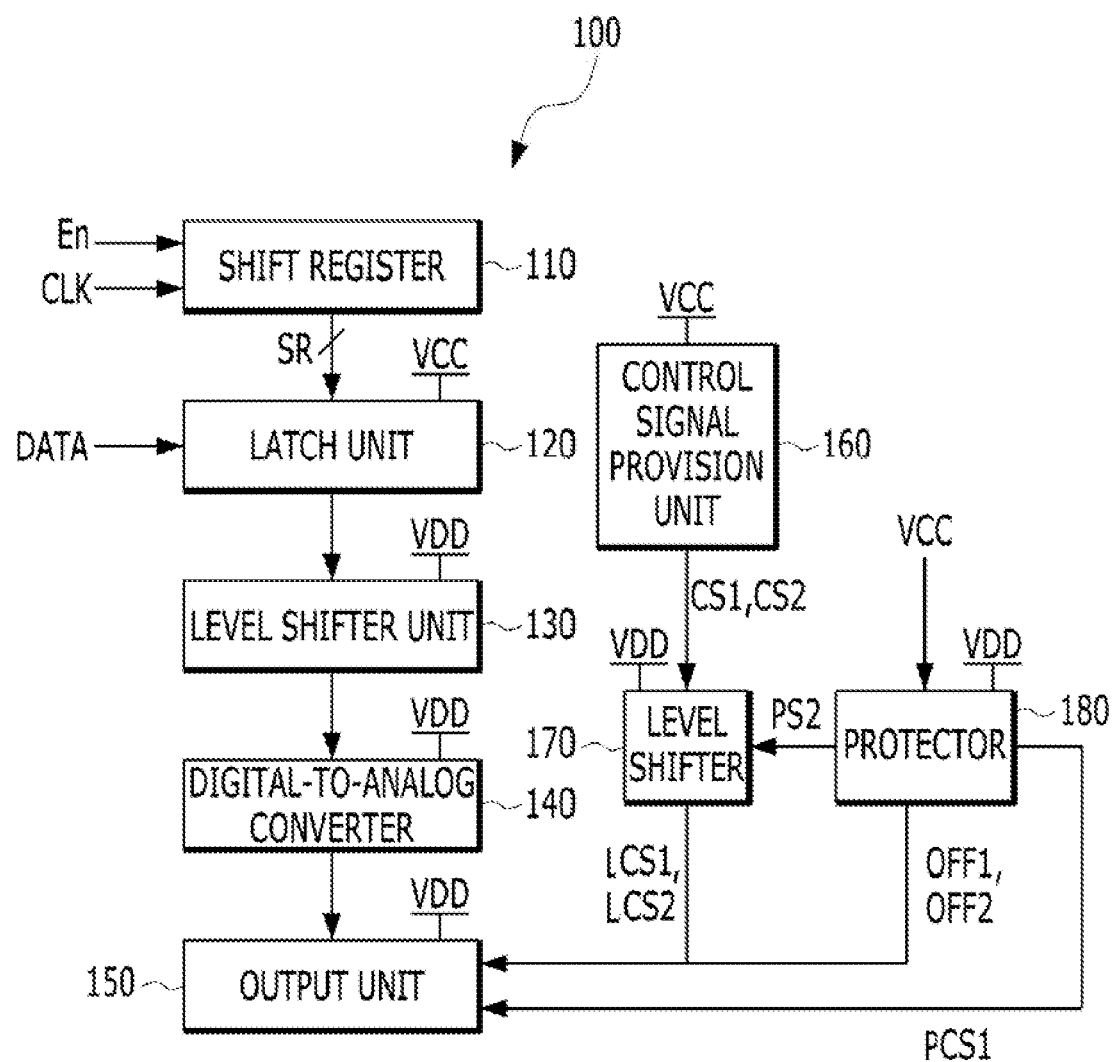
FIG. 1 is a diagram showing a configuration of an exemplary source driver according to one or more embodiments of the invention.

Reference will now be made in detail to embodiments of the present invention, examples of which are illustrated in the accompanying drawings.

In the following description of various embodiments, it will be understood that, when an element is referred to as being "on" or "under" another element, it can be directly on or under another element or can be indirectly on or under the other element with intervening elements therebetween. Furthermore, when the expression "on" or "under" is used herein, it may include the upward direction and the downward direction, with reference to an element.

In addition, it will be understood that relative terms used hereinafter, such as "first" and "second" "on"/"above"/"over" and "under"/"below"/"beneath" may be construed only to distinguish one element from another element without necessarily requiring or involving a certain physical or logical relationship or sequence between the elements. In addition, the same reference numerals will be used throughout the drawings to refer to the same or like parts.

The terms "including", "comprising", "having" and variations thereof disclosed herein mean "including but not limited to" unless expressly specified otherwise, and, as such, should not be construed to exclude elements other than the elements disclosed herein and should be construed to further include additional elements. In addition, the terms "corresponding" and variations thereof disclosed herein may involve at least one of the meanings of "facing," "overlapping" and "in a unique or 1:1 relationship with."

FIG. 1 is a diagram showing the configuration of an exemplary source driver 100 according to one or more embodiments of the present invention.

Referring to FIG. 1, the source driver 100 may include a shift register 110, a latch unit 120, a level shifter unit 130, a digital-to-analog converter unit 140, an output unit 150, a control signal provision unit 160, at least one level shifter (L/S) 170 and a protector 180.

The shift register 110 generates a shift signal SR in response to an enable signal En and a clock signal CLK to control the timing of data (e.g., digital image data) being sequentially stored in and/or read from the latch unit 120.

For example, the shift register 110 may receive a horizontal start signal from a timing controller 205 (see FIG. 4) or another controller and shift the received horizontal start signal in response to a clock signal CLK, thereby generating the shift signal SR. Here, the horizontal start signal may be used interchangeably with a start pulse.

The latch unit 120 stores data DATA received from the timing controller 205 in response to the shift signal SR.

For example, the data DATA received from the timing controller 205 may include R (Red), G (Green) and B (Blue) data.

In various embodiments, the latch unit 120 may include a first latch unit including a plurality of first latches configured to store the data DATA, and a second latch unit including a plurality of second latches configured to receive and store the data from the first latches.

The level shifter unit 130 shifts the voltage level of the data received from the latch unit 120. For example, the level shifter unit 130 may convert a first voltage level of the data from the latch unit 120 to a second voltage level. For example, the second voltage level may be greater than the first voltage level, without being limited thereto.

The bias voltage VDD of the level shifter unit 130 may be greater than the bias voltage VCC of the latch unit 120.

For example, the level shifter unit 130 may include a plurality of level shifters.

Each of the plurality of level shifters may correspond to one of the second latches of the latch unit 120.

For example, each of the plurality of level shifters may shift the voltage level of the data from a corresponding one of the second latches and output the data with a shifted voltage level.

The digital-to-analog converter unit 140 may convert the output (e.g., a digital signal) from the level shifter unit 130 using grayscale voltages received from a power supply (not shown) to an analog signal that is output to the output unit 150.

For example, the power supply (not shown) may comprise and/or be implemented by a plurality of resistors connected in series between a voltage source VDD and a ground voltage source VSS or GND to generate grayscale voltages divided into a plurality of steps (e.g., 256 steps).

For example, the digital-to-analog converter unit 140 may include a plurality of digital-to-analog converters, and each of the plurality of digital-to-analog converters may convert the output of a corresponding one of the plurality of level shifters of the level shifter unit 130 into an analog signal.

The output unit 150 amplifies and/or buffers the analog signal output from the digital-to-analog converter unit 140 and outputs the amplified and/or buffered analog signal.

The output unit 150 may include a plurality of amplifiers An and An+1 (n may be zero, 1, or a natural number greater than 1; see FIG. 3) or a plurality of buffers. Each of the plurality of amplifiers An and An+1 may amplify or buffer the analog signal output from a corresponding one of the plurality of digital-to-analog converters and output the amplified or buffered analog signal.

Figure 3:
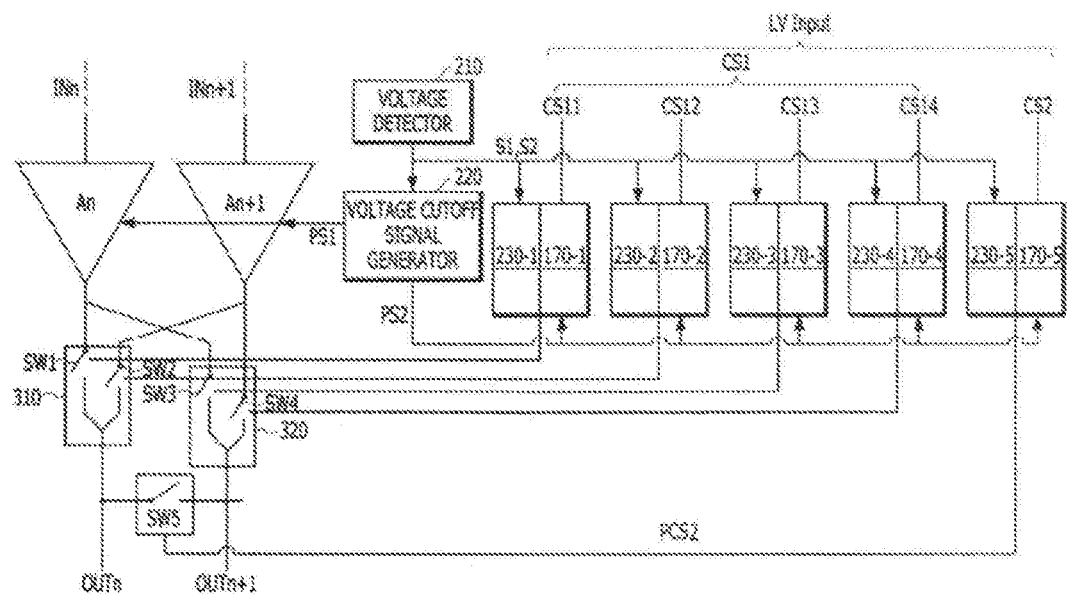
FIG. 3 is a diagram showing an exemplary output unit and control circuitry, including amplifiers, multiplexers, a charge sharing switch, a level shifter, a voltage detector, a voltage cutoff signal generator and a deactivation signal generator according to one or more embodiments of the present invention.

In addition, the output unit 150 may further include one or more multiplexers 310 and 320 (see FIG. 3) configured to output the amplified or buffered analog signal and/or perform an inversion process or operation, and at least one charge sharing switch SW5 (see FIG. 3).

The control signal provision unit 160 outputs a first control signal CS1 configured to control the multiplexers 310 and 320 of the output unit 150 and/or a second control signal CS2 configured to control the charge sharing switch SW5, based on or in response to the first bias signal VCC.

The signal provision unit 160 may comprise and/or be implemented by at least one inverter or buffer that uses the first bias signal VCC as a bias voltage.

For example, the inverter or buffer may receive a multiplexer control signal configured to control the multiplexers 310 and 320 from the timing controller 205, invert or buffer the received multiplexer control signal, and generate the first control signal CS1.

In addition, for example, another inverter or buffer in the signal provision unit 160 may receive a charge sharing control signal configured to control the charge sharing switch SW5 from the timing controller 205, invert or buffer the received charge sharing control signal, and generate the second control signal CS2.

At least one level shifter 170 shifts the voltage level of the first control signal CS1 based on or in response to the second bias signal VDD, outputs the level-shifted first control signal LCS1, shifts the voltage level of the second control signal CS2 based on or in response to the second bias signal VDD, and outputs the level-shifted second control signal LCS2.

For example, at least one level shifter 170 may include one or more first level shifters (e.g., 170-1 to 170-4, see FIG. 3) and at least one second level shifter 170-5 (see FIG. 3).

The one or more first level shifters (e.g., 170-1 to 170-4) may use the second bias signal VDD as a bias voltage, increase the voltage level of the first control signal CS1, and output a level-increased first control signal LCS1.

The at least one second level shifter 170-5 (see FIG. 3) may use the second bias signal VDD as a bias voltage, increase the voltage level of the second control signal CS2, and output a level-increased second control signal LCS2.

The voltage of the second bias signal VDD is greater than that of the first bias signal VCC. For example, the voltage of the second bias signal VDD may be two times to twenty times the voltage of the first bias signal VCC, without being limited thereto.

The protector 180 detects the voltage of the first bias signal VCC and turns off at least one of the amplifiers An and An+1 of the output unit 150, the at least one level shifter 170, the multiplexers 310 and 320 and the charge sharing switch SW5 when the detected voltage is less than a predetermined reference voltage.

For example, the protector 180 may detect the voltage of the first bias signal VCC and turn off the amplifiers An and An+1 of the output unit 150 and the at least one level shifter 170 when the detected voltage of the detected first bias signal VCC is less than the predetermined reference voltage.

In addition, for example, the protector 180 may detect the voltage of the first bias signal VCC and turn off the amplifiers An and An+1 of the output unit 150, the at least one level shifter 170 and the multiplexers 310 and 320 when the detected voltage of the first bias signal VCC is less than the predetermined reference voltage.

For example, the protector 180 may detect the voltage of the first bias signal VCC and turn off the switches SW1 to SW4 included in the multiplexers 310 and 320 when the detected voltage of the first bias signal VCC is less than the predetermined reference voltage.

For example, the protector 180 may detect the voltage of the first bias signal VCC and turn off the amplifiers An and An+1 of the output unit 150, the at least one level shifter 170, the multiplexers 310 and 320 and the charge sharing switch SW5 when the detected voltage of the first bias signal VCC is less than the predetermined reference voltage.

For example, the protector 180 may cut off the voltage (e.g., the second bias voltage VDD) provided to the amplifiers An and An+1 of the output unit 150 to turn off the amplifiers An and An+1 when the detected voltage of the first bias signal VCC is less than the predetermined reference voltage.

For example, the protector 180 may cut off the voltage (e.g., the second bias voltage VDD) provided to the at least one level shifter 170 to turn off the at least one level shifter 170 when the detected voltage of the first bias signal VCC is less than the predetermined reference voltage.

In addition, the protector 180 may generate a first switch control signal PCS1 configured to turn off the switches SW1 to SW4 of the multiplexers 310 and 320 and provide the generated first switch signal PCS1 to the multiplexers 310 and 320 when the detected voltage of the first bias signal VCC is less than the predetermined reference voltage. When the at least one level shifter 170 is turned off, the output of the at least one level shifter 170 may not be provided to the multiplexers 310 and 320.

For example, the protector 180 may generate a second switch control signal PCS2 (see FIG. 2) configured to turn off the charge sharing switch SW5 and provide the generated second switch signal PCS2 to the charge sharing switch SW5 when the detected voltage of the first bias signal VCC is less than the predetermined reference voltage.

Figure 2:
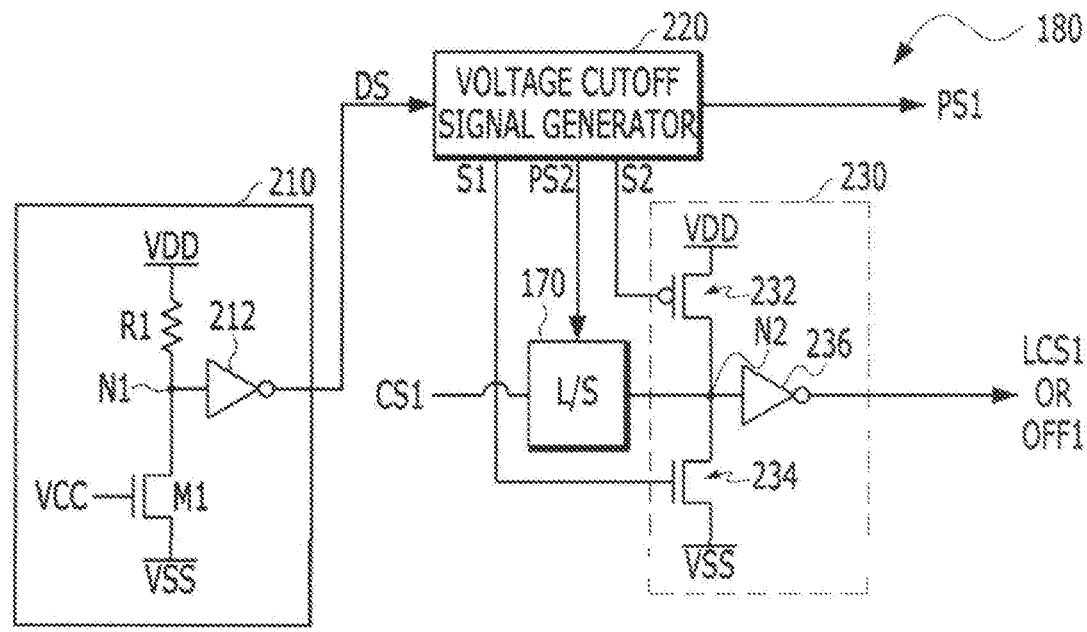
FIG. 2 is a diagram showing an embodiment of the protector shown in FIG. 1.

FIG. 2 is a diagram showing one or more embodiments of the exemplary protector 180 shown in FIG. 1.

Referring to FIG. 2, the protector 180 may include a voltage detector 210, a voltage cutoff signal generator 220, and a deactivation signal generator 230.

The voltage detector 210 detects the voltage of the first bias signal VCC and generates a detection signal DS based on and/or in response to the detected voltage.

The detection signal DS may have a first level when the detected voltage of the first bias signal VCC is less than a predetermined reference voltage and a second level when the detected voltage of the first bias signal VCC is equal to or greater than the predetermined reference voltage. For example, the first level may be lower than the second level, or vice versa.

For example, the voltage detector 210 may include a first node N1, a transistor M1 having a gate configured to receive the first bias signal VCC and source and drain terminals connected between the first node N1 and the ground voltage VSS (or the ground potential), a resistor R1 having one end configured to receive the second bias signal VDD and another end connected to the first node N1, and an inverter 212 connected to the first node N1. The output of the inverter 212 may be the detection signal DS.

In one or more other embodiments of the present invention, the inverter 212 may be omitted, and the output of the first node N1 may be the detection signal.

For example, the predetermined reference voltage may be a turn-on voltage of the transistor M1. When the voltage of the first bias signal VCC is less than the turn-on voltage of the transistor M1, the transistor M1 may be turned off. The level of the detection signal DS may be determined according to presence/absence of the inverter 212 and the number of inverters 212.

The voltage cutoff signal generator 220 may generate a first signal PS1 configured to turn off the amplifiers An and An+1 (FIG. 3) of the output unit 150 (FIG. 1) based on or in response to the detection signal DS.

That is, when the detected voltage of the first bias signal VCC is less than the predetermined reference voltage, the amplifiers An and An+1 (FIG. 3) may be turned off by the first signal PS1.

For example, the voltage (e.g., the second bias signal VDD) provided to the amplifiers An and An+1 (FIG. 3) may be cut off by the first signal PS1. For example, the output unit 150 (FIG. 1) may further include at least one first cutoff switch (not shown) configured to cut off the voltage (e.g., the second bias signal VDD) to the amplifiers An and An+1 (FIG. 3) based on or in response to the first signal PS1.

The voltage cutoff signal generator 220 may generate a second signal PS2 configured to turn off the at least one level shifter 170 based on or in response to the detection signal DS.

That is, when the detected voltage of the first bias signal VCC is less than the predetermined reference voltage, at least one level shifter 170 may be turned off by the second signal PS2.

For example, the voltage (e.g., the second bias signal VDD) to at least one level shifter 170 may be cut off by the second signal PS2. For example, at least one level shifter 170 may further include at least one second cutoff switch (not shown) configured to cut off the voltage (e.g., the second bias signal VDD) provided to the at least one level shifter 170 based on or in response to the second signal PS2.

The voltage cutoff signal generator 220 may generate one or more control signals S1 and S2 configured to control the deactivation signal generator 230 based on or in response to the detection signal DS.

The deactivation signal generator 230 may generate a first deactivation signal OFF1 configured to turn off the multiplexers 310 and 320 (FIG. 3) based on or in response to the one or more control signals S1 and S2.

The deactivation signal generator 230 may include a first transistor 232 controlled by the control signal S1 and a second transistor 234 controlled by the control signal S2, and output a voltage that may vary between the voltage of the second bias signal VDD and the voltage of the ground power source VSS to the second node N2.

For example, the first transistor 232 may include a first gate configured to receive the control signal S1, a first source or drain terminal configured to receive the second bias signal VDD, and a second source or drain terminal connected to the second node N2. In addition, the second transistor 234 may include a second gate configured to receive the control signal S2, a first source or drain terminal connected to the second node N2, and a second source or drain terminal connected to the ground voltage source VSS.

For example, the first transistor 232 may comprise and/or be implemented by a PMOS transistor, and the second transistor 234 may comprise and/or be implemented by an NMOS transistor. For example, the control signal S1 may be the inverted signal of the control signal S2.

To generate a first deactivation signal OFF1 and/or a second deactivation signal OFF2 (see FIG. 1), one of the first transistor 232 and the second transistor 234 may be turned on and the other turned off by the control signals S1 and S2.

When the detected voltage of the first bias signal VCC is less than the predetermined reference voltage, the first deactivation signal OFF1 may be generated by the control signals S1 and S2, and the multiplexers 310 and 320 (FIG. 3) may be turned off by the generated first deactivation signal OFF1.

The deactivation signal generator 230 may further include an inverter 236 or buffer connected to the second node N2.

When the voltage of the first bias signal VCC detected by the voltage detector 21 is equal to or greater than the predetermined reference voltage, the amplifiers An and An+1 (FIG. 3) and the level shifter 170 may be turned on or the amplifiers An and An+1 (FIG. 3) and the level shifter 170 may be powered on by the first and second signals PS1 and PS2.

In addition, when the voltage of the first bias signal VCC detected by the voltage detector 21 is equal to or greater than the predetermined reference voltage, the first transistor 232 and the second transistor 234 may be turned off by the control signals S1 and S2, and the deactivation signal OFF1 may not be generated. One switch (e.g., SW1) in the multiplexer (e.g., 310) may be controlled by the output LCS1 of at least one level shifter 170.

The level shifter related to or receiving the first control signal CS1 and configured to control the one switch in the multiplexers 310 and 320, and the amplifier of the output unit 150 corresponding thereto, are described in FIG. 2. The description of FIG. 2 is equally applicable to other switches in the multiplexers 310 and 320, the amplifiers of the output unit 150, and the level shifter corresponding thereto.

The description of FIG. 2 is equally applicable to the level shifter related to and/or receiving the second control signal CS2 configured to control the charge sharing switch SW5 and the amplifiers of the output unit 150 corresponding thereto.

FIG. 3 is a diagram showing the amplifiers An and An+1 of the output unit 150, the multiplexers 310 and 320, the charge sharing switch SW5, the level shifter 170, the voltage detector 210, the voltage cutoff signal generator 220 and the deactivation signal generator 230 of the source driver 100 according to one or more embodiments of the present invention.

Although two amplifiers An and An+1 corresponding to two channels of the source driver, two multiplexers 310 and 320, and one charge sharing switch SW5 are shown in FIG. 3, the numbers of amplifiers, multiplexers and charge sharing switches are not limited thereto, and may be increased to more than two.

For example, the source driver 100 may include the shift register 110, the latch unit 120, the level shifter unit 130, the digital-to-analog converter unit 140, the amplifiers An and An+1 configured to amplify the outputs INn and INn+1 of the digital-to-analog converter unit 140, the signal provision unit 160 configured to output the first control signal CS1 and the second control signal CS2 based on and/or in response to the first bias signal VCC, first level shifters 170-1 to 170-4 configured to shift the level of the first control signal CS1 based on and/or in response to the second bias signal VDD and output the level-shifted first control signal, a second level shifter 170-5 configured to shift the level of the second control signal CS2 based on and/or in response to the second bias signal VDD and output the level-shifted second control signal, output lines OUTn and OUTn+1 corresponding to the amplifiers An and An+1, the multiplexers 310 and 320 configured to selectively output the outputs of the amplifiers An and An+1 to the output lines OUTn and OUTn+1 based on and/or in response to the outputs of the first shifters 170-1 to 170-4, the charge sharing switch SW5 connected between the output lines OUTn and OUTn+1 and controlled based on and/or in response to the output of the second level shifter 175-5, and the protector 180 configured to detect the voltage of the first bias signal VCC, turn off the amplifiers An and An+1 and the first and second level shifters 170-1 to 170-5, and output a first deactivation signal OFF1 configured to turn on the multiplexers 310 and 320 and the second deactivation signal OFF2 for turn off the charge sharing switch SW5 when the voltage of the first bias signal VCC is less than the predetermined reference voltage.

The first level shifters 170-1 to 170-4 may include level shifters corresponding to the switches SW1 to SW4 included in the multiplexer.

Although one charge sharing switch is shown in FIG. 3, the present invention is not limited thereto, and the source driver may include a plurality of charge sharing switches, and the second level shifter 170-5 may include level shifters corresponding to the charge sharing switches.

The protector 180 may output the first signal PS1 configured to turn off the amplifiers An and An+1 and the second signal PS2 configured to turn off the first and second level shifters 170-1 to 170-5 when the detected voltage of the first bias signal VCC is less than the predetermined reference voltage.

The protector 180 may include the voltage detector 210 configured to output the detection signal DS based on the voltage of the first bias signal VCC, the voltage cutoff signal generator 220 configured to output the first signal PS1 configured to turn off the amplifiers An and An+1 and the second signal PS2 configured to turn off the first and second level shifters 170-1 to 170-5 based on and/or in response to the detection signal DS, and the deactivation signal generator 230 (230-1 to 230-5) configured to output the first deactivation signal OFF1 and the second deactivation signal OFF2 based on and/or in response to the detection signal DS.

For example, the deactivation signal generator 230 may include deactivation signal generators 230-1 to 230-5 corresponding to the first and second level shifters 170-1 to 170-5.

For example, the second node N2 of each of the deactivation signal generators 230-1 to 230-5 may be connected to the output terminal of a corresponding one of the level shifters 170-1 to 170-5.

The source driver 100 may include level shifters corresponding in number to the number of high-voltage components to be controlled (for example, switches SW1 to SW4 of the multiplexers 310 and 320) and the number of charge sharing switches SW5. In addition, the source driver 100 may include a number of deactivation signal generators corresponding to the number or plurality of level shifters 170.

As described above, in the source driver 100 according to one or more embodiments of the present invention, if the voltage of the first bias signal is abnormally low, the level shifter 170 and the amplifiers An and An+1 may be powered off, the outputs of the amplifiers An and An+1 may be cut off, and the level shifter 170 may be turned off. At the same time, the output of the level shifter 170 may be fixed to a predetermined level by the deactivation signal generator 230, and the multiplexers and the charge sharing switch may be turned off, thereby preventing a short-circuit between the outputs of the amplifiers.

When the voltage of the low-voltage power source of the source driver is abnormally dropped or cut off, the signal of the logic control circuit cannot be maintained in a normal state, and a short-circuit may occur in the amplifiers, the multiplexers and the charge sharing switches in the source driver.

In various embodiments, it is possible to prevent a phenomenon that, when the low-voltage power source VCC is suddenly cut off due to an abnormal cause, or when the voltage level of the low-voltage power source VDD abnormally falls when power is applied to the source driver IC and the source driver IC is operating or is in a standby state, the circuit blocks (e.g., the amplifiers, the multiplexers and the charge sharing switch) that utilize the high-voltage power source VDD are not normally controlled, which can result in generation of overcurrent or excess current. Thus, the source driver IC may be damaged or a fire may occur in the corresponding film package.

Figure 4:
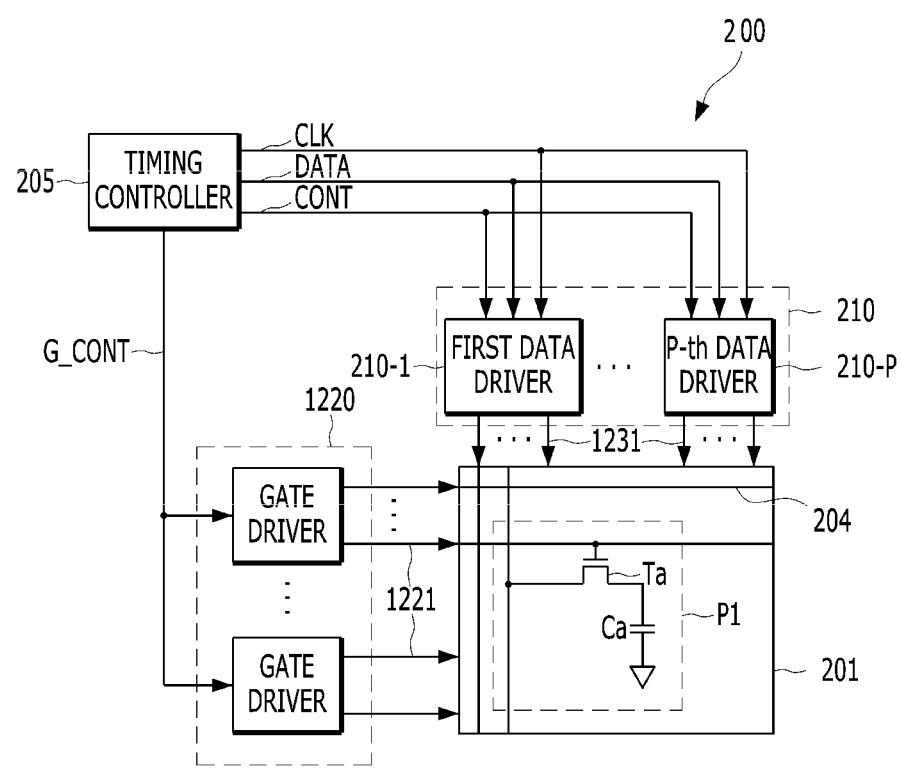
FIG. 4 is a diagram showing an exemplary display device according to one or more embodiments of the invention.

FIG. 4 is a diagram showing a display device 200 according to one or more embodiments of the present invention.

Referring to FIG. 4, the display device 200 includes a display panel 201, a timing controller 205, a source driver unit 210 and a gate driver unit 1220.

The display panel 201 includes gate lines 1221 forming rows and data lines 1231 forming columns, both of which intersect to form a matrix, and pixels connected to the intersecting gate lines and data lines.

The output lines of the source driver 100 (FIG. 1) may correspond to at least some of the data lines 1231 of the display panel 201 (FIG. 4), and the data lines may mean or represent channels of the display panel 201.

The pixels may be connected to the gate lines 1221 and the data lines 1231 and may be in a matrix having rows and columns.

Each pixel may include a transistor Ta connected to the gate line and the data line, and a capacitor Ca connected to the transistor Ta.

For example, each pixel may include a R (Red) sub-pixel, a G (Green) sub-pixel, and a B (Blue) sub-pixel, and each of the R, G, B sub-pixels may include a transistor Ta connected to the gate line and the data line, and a capacitor Ca connected to the transistor Ta.

The timing controller 205 outputs a clock signal CLK, data DATA, a first control signal CONT configured to control the source driver 210, and a second control signal G CONT configured to control the gate driver 1220.

Although the clock signal CLK, the data DATA, and the first control signal CONT are transmitted to the drivers 210-1 to 210-P through three transmission lines shown in FIG. 4, the present invention is not limited thereto. In one or more other embodiments of the present invention, the clock signal CLK, the data DATA, and the first control signal CONT may be transmitted to the drivers 210-1 to 210-P through one transmission line at or over various time intervals (e.g., using time division).

For example, the first control signal CONT may include a horizontal start signal, an enable signal En and a clock signal CLK input to the shift register 110 (see FIG. 1) of the source driver. The second control signal G CONT may include a gate drive signal configured to enable driving the gate lines 1221.

The gate driver unit 1220 may drive the gate lines 1221, include a plurality of gate drivers, and output gate drive signals configured to control (e.g., turn on and off) the transistors Ta of the pixels to the gate lines 1221.

The source driver unit 1210 may drive the data lines or the channels 1231 of the display panel and may include a plurality of source drivers 210-1 to 210-P (P being a natural number greater than 1).

The number of the source drivers 210-1 to 210-P (P being a natural number greater than 1) may be equal to the number of output pins P1 to Pn in the source driver 100 of the FIG. 1 according to one or more embodiments of the present invention.

According to one or more embodiments of the present invention, it is possible to prevent a phenomenon that, when the voltage level of a low-voltage power source abnormally drops, the amplifiers, multiplexers and charge sharing switch (es) that utilize a high-voltage power source are turned off or controlled to prevent generation of overcurrent or excess current. Thus, the present source driver IC may avoid damage or causing a fire in a corresponding film package.

Characteristics, structures, effects, and so on described in the above embodiments are included in at least one of the embodiments, but are not limited to only one embodiment. Furthermore, it is apparent that the features, structures, effects, and so on described in the various embodiments can be combined or modified with one or more other embodiments by persons skilled in the art. Therefore, it should be understood that the contents relevant to such combination and modification fall within the scope of the present invention.

What is claimed is:

1. A source driver comprising:
a digital-to-analog converter configured to receive a data signal, convert the received data signal into an analog signal, and output the analog signal;
amplifiers configured to amplify the analog signal;
a control signal provision unit configured to output a first control signal and a second control signal based on or in response to a first bias signal;
a first level shifter configured to shift a level of the first control signal based on or in response to a second bias signal having a voltage greater than that of the first bias signal and to output a level-shifted first control signal;
a second level shifter configured to shift a level of the second control signal based on or in response to the second bias signal and output a level-shifted second control signal;
output lines corresponding to the amplifiers;
a multiplexer configured to selectively output the amplified analog signals from the amplifiers to the output lines based on or in response to output of the first level shifter;
a charge sharing switch connected between the output lines and controlled based on or in response to output of the second level shifter; and
a protector configured to detect a voltage of the first bias signal and to turn off the amplifiers, the first level shifter and the second level shifter and output a first deactivation signal configured to turn off the multiplexer and a second deactivation signal configured to turn off the charge sharing switch, when the detected voltage of the first bias signal is less than a predetermined reference voltage, wherein the protector includes:
a voltage detector configured to output a detection signal based on the voltage of the first bias signal;
a voltage cutoff signal generator configured to output a first signal configured to turn off the amplifiers and a second signal configured to turn off the first and second level shifters based on or in response to the detection signal; and
a deactivation signal generator configured to output the first deactivation signal and the second deactivation signal based on or in response to the detection signal.

2. The source driver according to claim 1, wherein the protector outputs a first signal configured to turn off the amplifiers and a second signal configured to turn off the first and second level shifters when the detected voltage of the first bias signal is less than the predetermined reference voltage.

3. The source driver according to claim 2, wherein the voltage cutoff signal generator turns on the amplifiers and the first and second level shifters, and the deactivation signal generator does not output the first and second deactivation signals when the detected voltage of the first bias signal is equal to or greater than the predetermined reference voltage.

4. The source driver according to claim 1,
wherein the voltage detector includes:
a first transistor including a first gate configured to receive the first bias signal and source and drain terminals connected between a first node and a ground; and
a resistor configured to receive the second bias signal at one end and the connected to the first node at another end, and
the detection signal is output from the first node.

5. The source driver according to claim 1,
wherein the voltage detector includes:
a transistor including a gate configured to receive the first bias signal and a source and drain terminals connected between a first node and a ground;
a resistor including one end configured to receive the second bias signal at one end and connected to the first node at another end; and
an inverter connected to the first node, and
the detection signal is output from the first inverter.

6. The source driver according to claim 1,
wherein the deactivation signal generator includes a first deactivation signal generator including a first transistor including a first gate, a first source configured to receive the second bias signal, and a first drain connected to a second node and a second transistor including a second gate, a second drain connected to the second node, and a second source connected to a ground, and
wherein the voltage cutoff signal generator outputs a first gate control signal configured to control the first gate and a second control signal configured to control the second gate.

7. The source driver according to claim 6, wherein the second node is connected to an output terminal of the first level shifter.

8. The source driver according to claim 7, wherein the first deactivation signal generator further includes a second inverter connected to the second node.

9. The source driver according to claim 6,
wherein the deactivation signal generator further includes a second deactivation signal generator including a third transistor including a third gate, a third source configured to receive the second bias signal, and a third drain connected to a third node and a fourth transistor including a fourth gate, a fourth drain connected to the third node, and a fourth source connected to the ground, and
wherein the voltage cutoff signal generator outputs a third gate control signal configured to control the third gate and a fourth gate control signal configured to control the fourth gate.

10. The source driver according to claim 9, wherein the third node is connected to an output terminal of the second level shifter.

11. The source driver according to claim 10, wherein the second deactivation signal generator further includes a third inverter connected to the third node.

12. A display device comprising:
a display panel including gate lines, data lines, and pixels connected to the gate lines and the data lines in a matrix including rows and columns;
the source driver of claim 1, wherein the source driver is configured to drive the data lines; and
a gate driver configured to drive the gate lines.

* * * * *